(12) United States Patent
Li et al.

(10) Patent No.: US 6,944,813 B2
(45) Date of Patent: Sep. 13, 2005

(54) WEIGHTED DECODING METHOD AND CIRCUITS FOR COMMA-FREE REED-SOLOMON CODES

(75) Inventors: Chi-Fang Li, Taichung Hsien (TW); Wern-Ho Sheen, Chia I Hsien (TW); Yuan-Sun Chu, Chia I Hsien (TW); Jan-Shin Ho, I Lan Hsien (TW); Yuan-Tzu Ting, Hsinchu (TW)

(73) Assignee: Chung Shan Institute of Science and Technology, Taochun (TW)

( * ) Notice: Subject to any disclaimer, the term of this patent is extended or adjusted under 35 U.S.C. 154(b) by 518 days.

(21) Appl. No.: 10/120,546

(22) Filed: Apr. 12, 2002

(65) Prior Publication Data

US 2003/0196161 A1 Oct. 16, 2003

(51) Int. Cl.[7] ............................................. H03M 13/15
(52) U.S. Cl. ...................... 714/759; 714/775; 714/784
(58) Field of Search ................................ 714/759, 775, 714/784

(56) References Cited

U.S. PATENT DOCUMENTS

| | | | | |
|---|---|---|---|---|
| 5,630,154 A | * | 5/1997 | Bolstad et al. ................ 712/19 |
| 6,363,060 B1 | * | 3/2002 | Sarkar ........................ 370/342 |
| 6,504,830 B1 | * | 1/2003 | Ostberg et al. ............. 370/342 |
| 6,587,852 B1 | * | 7/2003 | Svingen et al. ................ 707/6 |
| 6,665,277 B1 | * | 12/2003 | Sriram ....................... 370/324 |
| 6,675,187 B1 | * | 1/2004 | Greenberger ............... 708/622 |
| 6,731,673 B1 | * | 5/2004 | Kotov et al. ................ 375/145 |

* cited by examiner

*Primary Examiner*—Stephen M. Baker
(74) *Attorney, Agent, or Firm*—Birch, Stewart, Kolasch & Birch, LLP

(57) ABSTRACT

A weighted decoding method and circuits for Comma-Free Reed-Solomon codes that apply to a cell search in a wideband code division multiple access system. The invention also provides a weighted decoding method wherein the decoding result of the secondary synchronization code is used as a weight for received Comma-Free Reed-Solomon symbol data, and the weighted symbol data is input to the processing element array of the decoding circuit, so as to perform a weighted correlating comparison and thus enhance the accuracy of the decoding result. The weighted decoding method put forward by the invention may apply to a decoding architecture that is based on a systolic array and the decoding architecture that is based on a folding systolic array.

15 Claims, 12 Drawing Sheets

WEIGHTED DECODING METHOD AND CIRCUITS FOR COMMA-FREE REED-SOLOMON CODES

FIELD OF THE INVENTION

The invention generally relates to a weighted decoding method and circuits for Comma-Free Reed-Solomon codes that applies to a cell search in a wideband code division multiple access system, and more particularly relates to a weighted decoding method that is applied to the decoding circuit that is based on a systolic array and a decoding circuit that is based on a folding systolic array.

BACKGROUND OF THE INVENTION

For the third generation partnership project (hereinafter referred as the 3GPP) wideband code division multiple access (hereinafter referred as W-CDMA) system, the cell search process employed by a cellular phone has to execute a series of detections and testing procedures of synchronization codes in order to synchronize the cellular phone with its best base station. In general, the cell search algorithm of the 3GPP W-CDMA is divided into three ordered steps: 1) slot synchronization, 2) frame synchronization and code-group identification, and 3) scrambling-code determination. The first step involves using a primary synchronization code (hereinafter referred as PSC) to achieve slot synchronization. The second step involves using both the secondary synchronization codes (SSCs) and the Comma-Free Reed-Solomon (hereinafter referred as CFRS) codes to achieve frame synchronization and code-group identification. The third step involves using all the possible scrambling codes of the identified code group to execute a de-scrambling procedure for scrambling-code determination. Before achieving the synchronization, the cellular phone cannot begin to decode various channel messages broadcasted by the base station or measure various channel effects.

In this invention, we are concerned with that the second step of the synchronization procedure, which involves decoding the CFRS code so as to determine the frame boundary and code group. The CFRS code is a Comma-Free code and Reed-Solomon code and thus it has the features of both. The Comma-Free code has a feature that no new Comma-Free code word can be created by combining any two Comma-Free code words. It is capable of being used for both error detection and synchronization simultaneously. The synchronization capability of a Comma-Free code is used by 3GPP W-CDMA to achieve frame synchronization. Generally, a Comma-Free code decoding circuit is composed of simple correlators. However, in 3GPP W-CDMA, the Comma-Free code is transmitted intermittently as opposed to the continual transmission used in other applications. Therefore, an ordinary Comma-Free code decoder is not applicable to the synchronization procedure of 3GPP W-CDMA.

The CFRS code is a (15, 3) Reed-Solomon (hereinafter referred as RS) code with a powerful error correction capability that is essential to 3GPP W-CDMA. The design of a RS decoder has been discussed in detail in many articles, and the most widely used decoding method can be described as having four steps: 1) syndrome calculation of the received code word, 2) error locator polynomial and error evaluator computations, 3) error location calculation, and 4) error value calculation. However, in the 3GPP W-CDMA, the set of CFRS codes is composed of 64 special RS codes and thus an ordinary RS decoder is unsuitable.

3GPP W-CDMA uses 64 CFRS codes to represent 64 code groups. Each code word consists of 15 symbols. Every code group includes eight scrambling codes. Every base station treats one of the eight scrambling codes of the code group to which it belongs as its scrambling code for differentiating itself from the other stations. To be connected through a certain base station, a cellular phone has to achieve scrambling code synchronization with the base station first. As described above, the synchronization process has to include a decoding procedure of a CFRS code for frame boundary detection and code-group determination.

The symbols of the CFRS code are chosen from the elements of Galois Field (GF)(16). Among the 16 secondary synchronization codes transmitted via a secondary synchronization channel, an $n^{th}$ cyclic-shift synchronization code represents that the $n^{th}$ code symbol, an element of GF (16), is regarded as the first code symbol. Symbols are selected to form 64 CFRS codes to represent 64 code groups. To transmit the CFRS codes, a base station sends identical codes in each frame. However, prior to frame synchronization, the assumed initial position for the receipt of CFRS codes is not necessarily occupied by the first code symbol, but can be occupied by any one of the 15 code symbols. Since the same CFRS code is transmitted in each frame, it is possible to receive 15 code symbols continuously even before a frame boundary is determined. The consecutive received 15 code symbols correspond to a cyclic-shift version of a CFRS code word. The aim of decoding is to identify the received code word as one of the 64 CFRS codes in order to determine the code group, and to detect the cyclic-shift amount so as to determine the frame boundary.

According to the above description, there are 64 CFRS codes and 15 cyclic-shift versions of each code word. Thus there can be a total of 960 (64×15) combinations of cyclic-shift code word. The evaluation of these 960 cyclic-shift hypotheses requires a lot of complicated calculations, and more importantly, timely accomplishment of these calculations in order to avoid delay in the synchronization procedure that would cause more serious problems. Hence, decoding speed has a direct impact on real-time synchronization. A "fast" CFRS decoder is an indispensable component for the cell search algorithm.

The decoding methods discussed in the existing literature regarding the mathematical calculations of synchronization merely involve direct comparison of these 960 combinations, thus there is no optimal decoding method, nor is there any optimal architecture for hardware implementation. Therefore, it is a good idea in implementing the direct decoding method based on the 960 combinations to develop decoding hardware architecture that works optimally, as well as to put forward a decoding method that is optimal.

SUMMARY OF THE INVENTION

In view of the aforesaid technical problems, the invention provides a kind of speedy decoding circuit architecture that applies to the CFRS code of 3GPP W-CDMA, not only to support various kinds of cell search algorithms, but also to meet the demand for frequent decoding in multi-candidate cell search algorithms.

In the cell search procedure of the 3GPP W-CDMA, there are many options for an execution strategy. For example, serial execution of the three steps of the synchronization procedure, simultaneous execution of the synchronization procedure in a pipelined manner, or selecting several slot boundary candidates in step 1 and simultaneously executing steps 2 & 3 by means of the various slot boundary candidates are all possible and feasible. Each algorithm produces different CFRS decoding speed. Serial cell search does not produce fast decoding. Pipelined cell search produces a decoder with high decoding speed. The multi-candidate method produces a decoder with extremely high decoding speed meeting the need for frequent decoding. The invention provides the means to provide all of the aforesaid arrangements, i.e., providing decoding circuits that work at high or low decoding speeds. Whenever a high decoding speed is required, it meets the decoder requirements of the cell search algorithm. Whenever a low decoding speed is acceptable, it executes decoding with the minimal number of components so as to reduce power consumption.

Another object of the invention is to provide a weighted CFRS decoding method wherein 960 possible combinations of CFRS codes are decoded by means of weighted correlation after 15 code symbols have been completely received.

The circuit used for the decoding method put forward by the invention is based on a systolic array architecture. This architecture is characterized by speedy decoding and thus it meets various demands of cell search algorithms. In addition, with a folding technique of the systolic array architecture, the weighted decoding method put forward by the invention reduces the area of its array without jeopardizing its speedy decoding feature.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED EXPLANATION OF THE INVENTION

Figure 1:
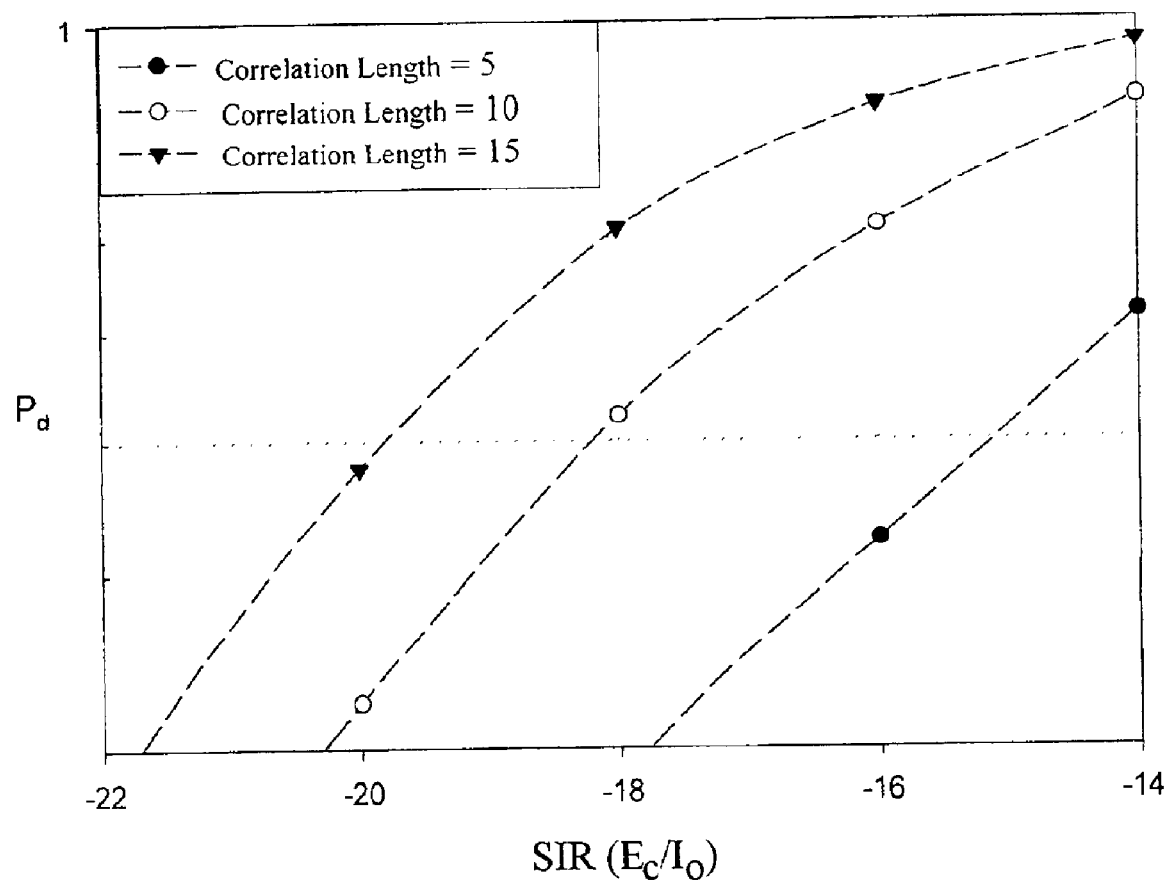
FIG. 1 depicts the comparison of the efficiency of CFRS decoding at different decoding lengths.

As shown in FIG. 1, the 960 combinations of CFRS codes can be decoded better with a complete set of 15 code symbols rather than with part of the code symbols. Hence, in the invention, after 15 code symbols have been received, a frame boundary is determined by making reference to a direct comparison of the 15 code symbols.

The decoding method adopted by the invention can be denoted in the following way:

$$(i, j) = \text{Arg}\{\max\{X_i \otimes H_j\}_{j=0-63}^{i=0-14}\} \quad (1)$$

where i denotes the index for the 15 cyclic-shift versions, j denotes the index for the 64 CFRS codes, $X_i$ denotes the result of i time(s) of rightward cyclic-shift of the CFRS codes received, while $X_0$ denotes the result of arbitrary cyclic-shift of the received CFRS codes in the beginning; and, $X_i = \{x_1, x_2, x_3, \ldots, x_{15}\}$, $x_k \in GF(16)$, $1 \leq k \leq 15$. $H_j$ denotes one of the 64 CFRS codes, and $H_j = \{h_1, h_2, h_3, \ldots, h_{15}\}$, $h_k \in GF(16)$, $1 \leq k \leq 15$. Finally, $X_i \otimes H_j$ refers to making a correlating comparison.

Figure 2:
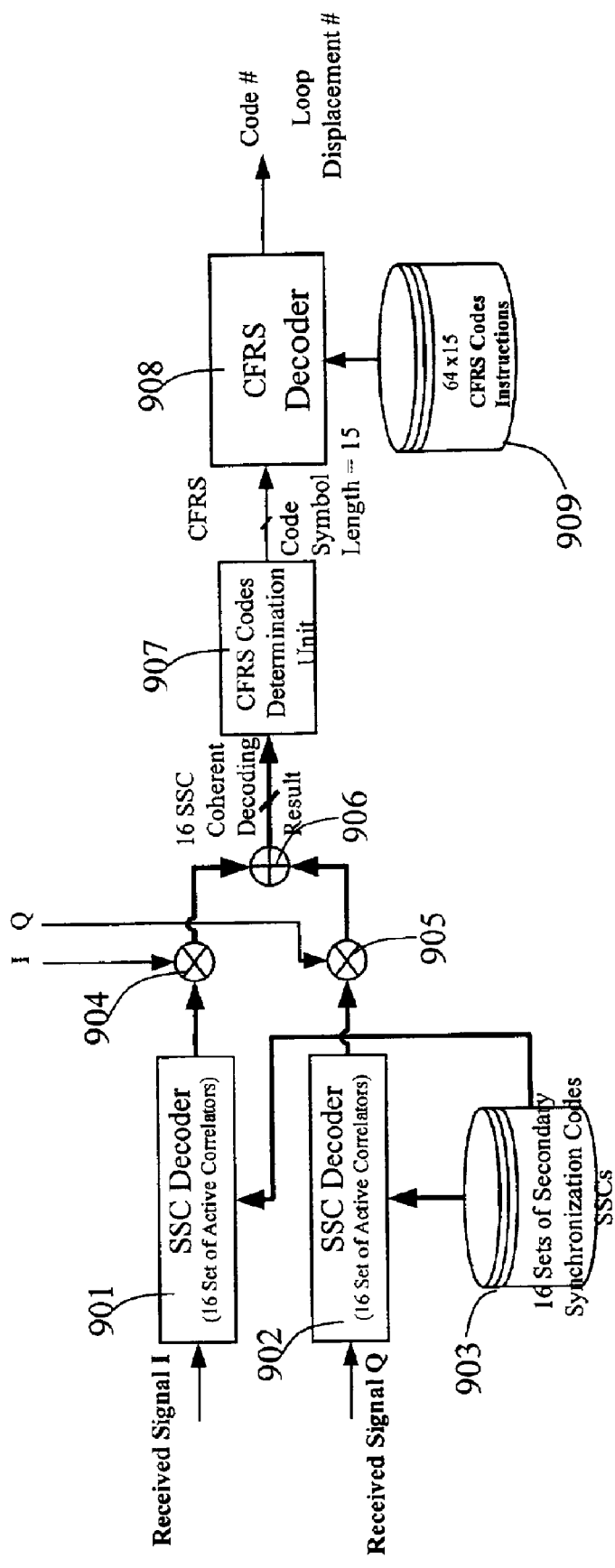
FIG. 2 shows the coherent decoding process (step 2) of the synchronization procedure; the reference value for coherent detection is the decoding result of the same chip of the primary synchronization decoder.

In order to ensure the accuracy of the CFRS decoding results, the invention puts forward a weighted decoding method wherein decoding is carried out by means of weighted correlation after 15 code symbols have been completely received. FIG. 2 depicts this weighted correlation decoding method.

First of all, the determination of the secondary synchronization code (SSC) is carried out according to a coherent detection. The detection value of the primary synchronization code is regarded as a reference value. After coherently combining the detection values of 16 SSCs with that of the primary synchronization code (PSC), the greatest value from the 16 results is found. The greatest value represents which CFRS code symbol was transmitted. FIG. 2 depicts the coherent combination. With the SSC decoder 901 and the SSC decoder 902, the received SSC is decoded by means of the 16 secondary synchronization codes 903. The primary synchronization code result is multiplied by the decoding result of the two SSC decoders 901 & 902 through the multipliers 904 & 905. After the coherent combination, those results are added up by the adder 906 so as to acquire the coherent detection result of the 16 SSCs.

The CFRS codes determination element 907 determines the cyclic-shift CFRS code word. After 15 code symbols have been received, the CFRS decoder 908 makes comparisons according to the 64×15 reference CFRS code symbols 909, and outputs the cyclic-shift index for the closest cyclic-shift CFRS code word. The maximum SSC decoding value is used as the so-called "weight" of a code symbol. While making a weighted correlating comparison for the CFRS codes, it is necessary to compare each of the code symbols first. If the code symbols are identical, then the weights of the code symbols are added to the weighted CFRS decoding results. Finally, all possible weighted decoding results are compared.

As regards the weighted correlating comparison method put forward by the invention, its decoding method may be denoted in the following way:

$$(i, j) = \text{Arg}\{\max\{X_i \cdot H_j\}_{j=0-63}^{i=0-14}\} \quad (2)$$

where i denotes the index for the 15 cyclic-shift versions, j denotes the index for the 64 CFRS codes, $X_i$ denotes the result of i time(s) of rightward cyclic-shift of the CFRS codes received, while $X_0$ denotes the result of arbitrary cyclic-shift of the received CFRS codes in the beginning; and, $X_i = \{x_1, x_2, x_3, \ldots, x_{15}\}$, $x_k \in GF(16)$, $1 \leq k \leq 15$. $H_j$ denotes one of the 64 CFRS codes, and $H_j = \{h_1, h_2, h_3, \ldots, h_{15}\}$, $h_k \in GF(16)$, $1 \leq k \leq 15$. Finally, $X_i \otimes H_j$ refers to making a weighted correlating comparison that may be denoted in the following way:

$$X_i \cdot H_j = \sum_{k=1}^{15} w_k (x_k \otimes h_k) \quad (3)$$

where k denotes the index of the code symbol in a correlating comparison, $w_k$ denotes the weight of the code symbol, $x_k$. As mentioned above, $w_k$ is the maximum detections value of SSC. $x_k \otimes h_k$ refers to making a correlating comparison between $x_k$ and $h_k$. If they are found to be identical, then the result is 1. If they are found to be different, then the result is 0. The judgment may be converted into the logical gate of exclusive-OR, XOR, as far as hardware is concerned.

The aforesaid weighted decoding method is carried out by executing the weighted correlating comparison denoted by equation (3), and finding the greatest weighted correlation value of 960 weighted correlations. The cyclic-shift index i, and the index of the 64 CFRS codes saved beforehand, j, are the decoding result. The index of the 64 reference CFRS codes saved beforehand, j, determines the code group, while the cyclic-shift index i determines the frame boundary, so as to complete step 2 of the synchronization procedure of 3GPP W-CDMA.

According to equation (2), the decoding method put forward herein is to carry out a rightward cyclic-shift repeatedly with respect to the arbitrary cyclic-shift condition of the received CFRS codes. Only 14 cyclic-shifts are required—much less than the 64×14 cyclic-shifts performed for each of the 64 CFRS codes saved beforehand. As a result, power consumption of the decoding circuit is reduced.

The aforesaid weighted decoding method is summed up as follows:

1. Preceding Procedure

First of all, the determination and assumption of SSC is carried out according to a coherent decoding strategy. The decoding value of the primary synchronization code is regarded as a reference value. Acquire 16 results by coherently combining the decoding value of 16 SSC with that of the primary synchronization code (PSC).

Then, find the greatest value from the 16 sets of results. The position of the greatest value among the 16 results represents the position of the transmitted CFRS code symbol among the elements of GF (16). The greatest value acquired after the coherent detection is regarded as the weight of this code symbol.

2. Weighted Decoding Procedure

First of all, make a correlating comparison between the received CFRS codes and the 960 combinations. If the code symbols are identical, the weights of these code symbols are added to the weighted correlating comparison results. If they are different, nothing should be done.

Find the greatest correlating value from all the 960 correlating comparison results. The position of the code of the greatest result among the 64 sets of CFRS codes indicates the intended code group. The number of times of its cyclic-shift represents the frame boundary.

To implement the aforesaid decoding method, SA architecture and folding SA architecture may be adopted. Explanation is provided below:

I. The Decoding Circuit Based on SA Architecture

Figure 3:
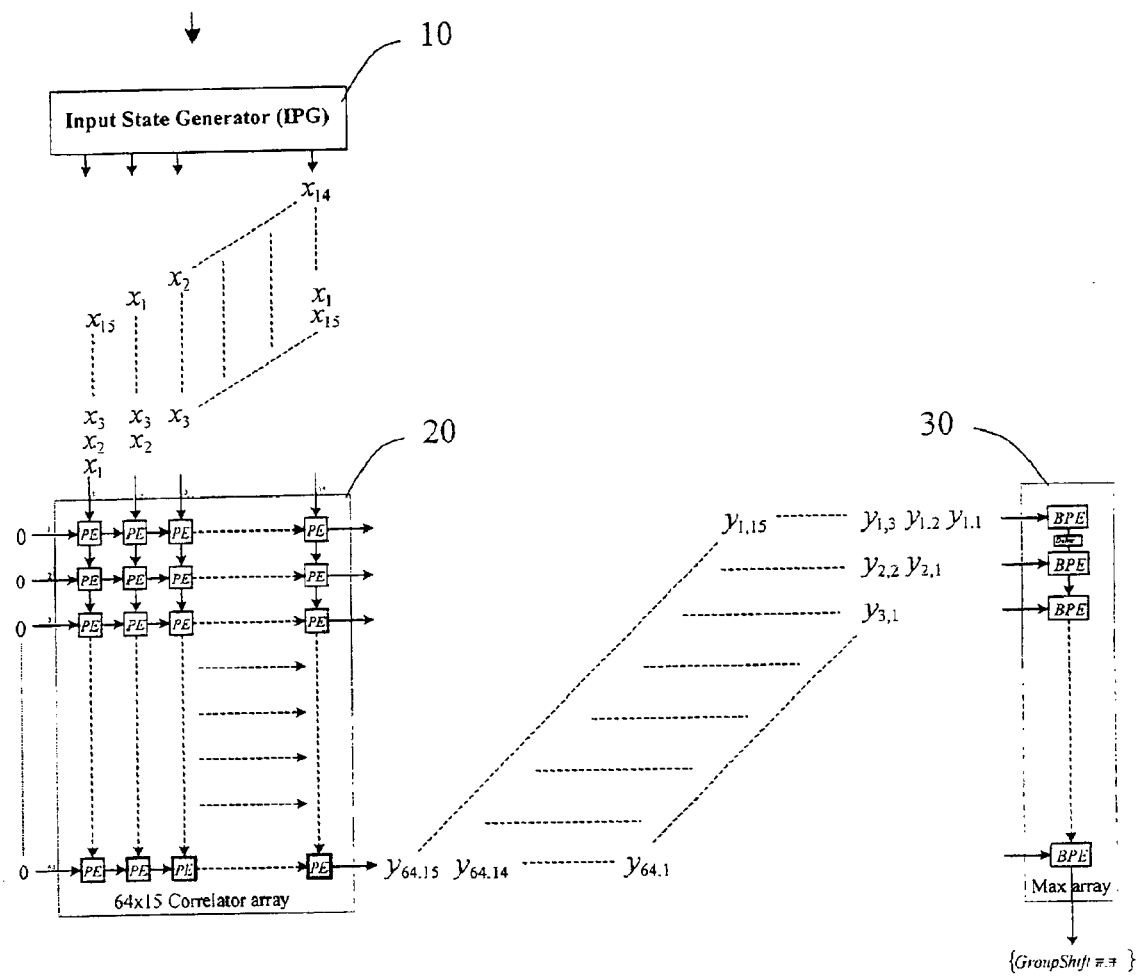
FIG. 3 shows a CFRS decoder based on SA architecture, wherein $x_i$ denotes the received code symbol and $y_{j,i}$ denotes the result of a correlating comparison.

As shown in FIG. 3, the decoding circuit comprises several components, namely an Input Pattern Generator (IPG) 10, a 64×15 Weighted Processing Element Array (WPEA) 20, and a 64×1 Boundary Processing Element Array (BPEA) 30.

Figure 4:
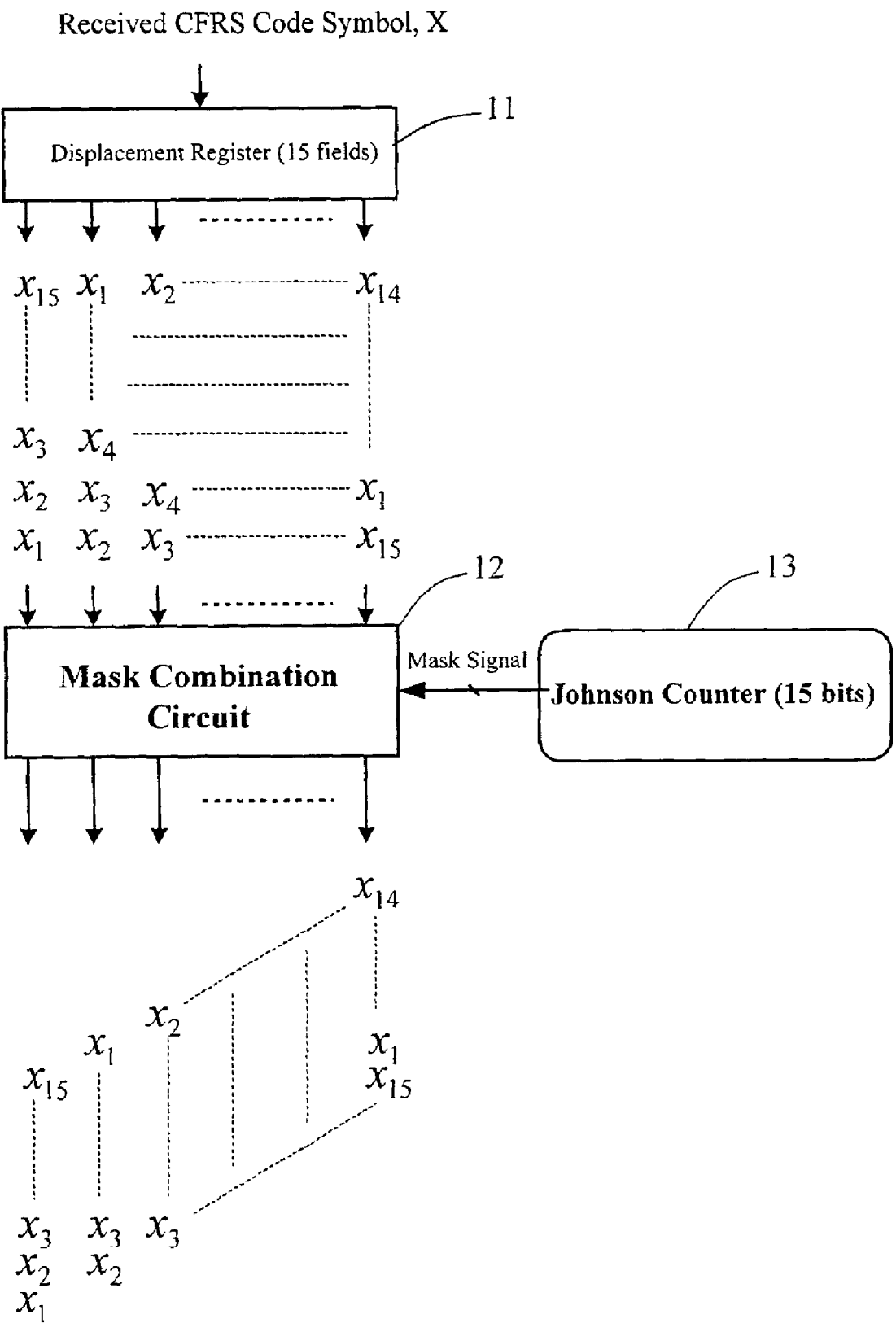
FIG. 4 depicts the structure of IPG.

The main function of the IPG 10 is to generate 15 cyclic-shift versions from the arbitrarily cyclic-shift CFRS codes, X, wherein $X_i$, $0 \le i \le 14$, then output the cyclic-shift versions to the WPEA 20 in a skewed-form required by the SA architecture. The output comprises all 15-cyclic-shift versions, and, as shown in FIG. 4, its circuit structure comprises a shift register 11, a Johnson counter 13, and a masking combinational circuit 12. Its process is described below.

First of all, a code received, X, is loaded to the shift register 11. The shift register 11 then generates its 15 cyclic-shift versions separately. The Johnson counter 13 generates the required skewed mask. With the masking combinational circuit 12, the 15 cyclic-shift versions are turned into the required 15 cyclic-shift versions in skewed-form generated by the skewed mask, and the latter is regarded as the input to the underlying WPEA 20 that is based on SA architecture.

Figure 5:
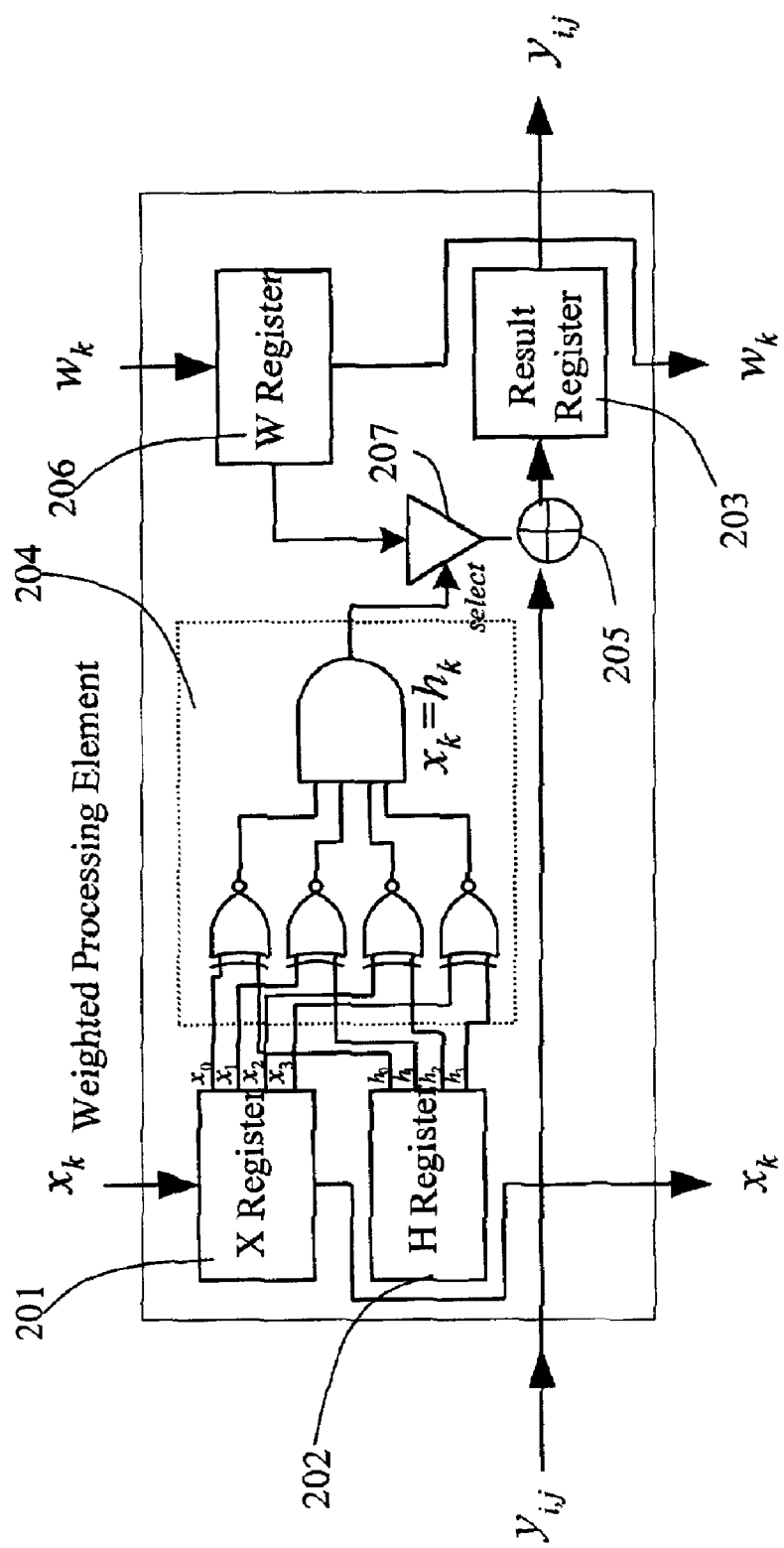
FIG. 5 depicts the circuit of WPE.

The WPEA 20 is a kind of SA architecture composed of 64×15 WPE. The structure of each WPE is shown in FIG. 5, and the primary function of the WPE is to make a weighted correlating comparison. IPG 10 generates all the 15 cyclic-shift versions that are then compared with 64 CFRS codes.

Figure 7A:
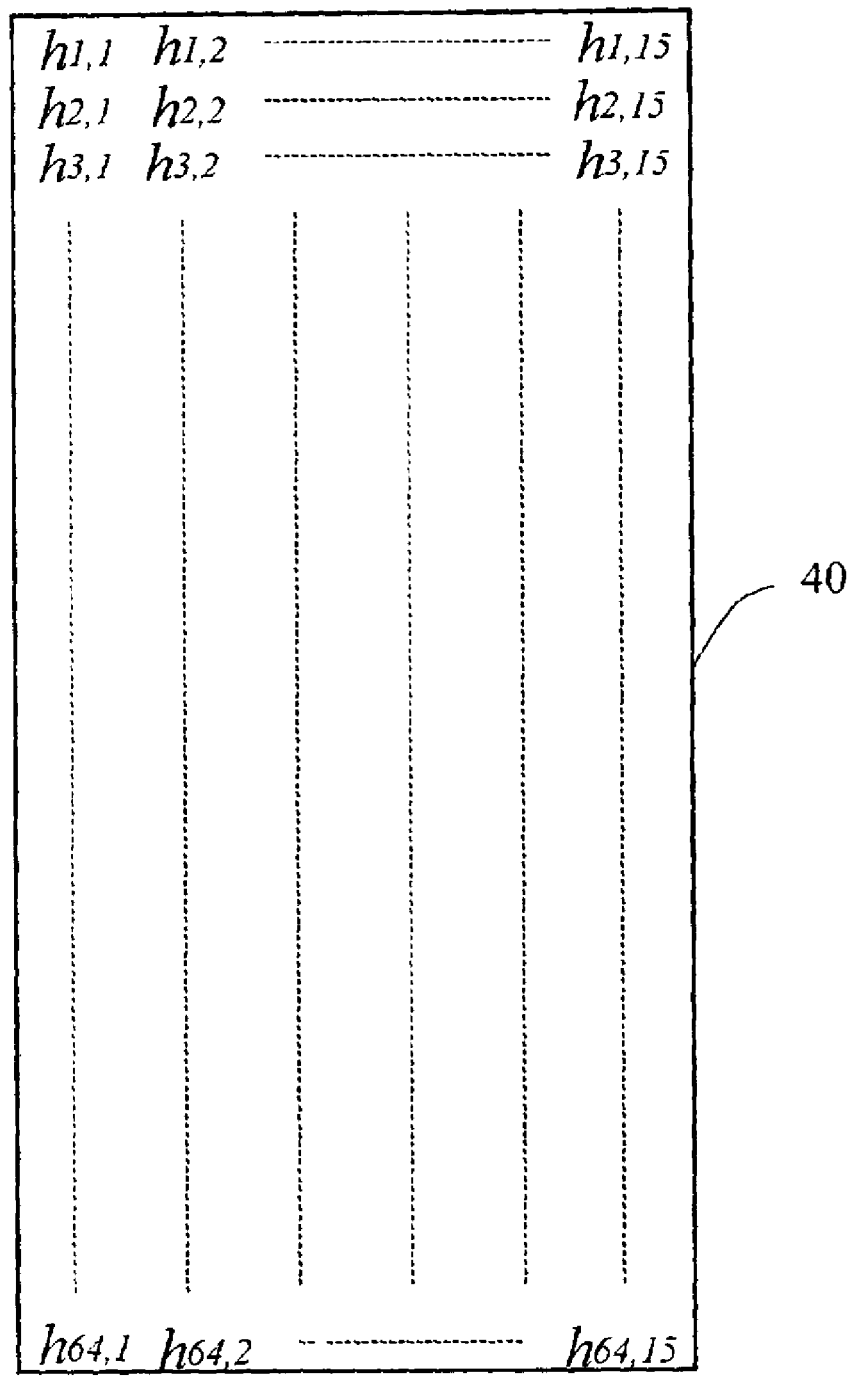
FIGS. 7A–7C shows the table of 64 sets of CFRS codes and the table of its segments after folding.

There are four registers in each WPE, namely an H register 202, X register 201, Y result register 203 and W register 206. The H register 202 is for storing the code symbols, $h_k$, of CFRS code beforehand, or, in other words, the 64×15 CFRS code symbol table 40 shown in FIG. 7A is put in the H register 202 of every WPE of the 64×15 WPEA 20 by mapping. Since there are 64 CFRS codes, and each set consists of 15 code symbols, it is processed by a 64×15 WPEA 20. The X register 201 is for storing the code Symbols, $x_k$, sent by the overhead WPE. Given the comparison combinational circuit 204 shown in FIG. 5, when the two code symbols stored in the X register 201 and the H register 202, respectively, are identical, and given the switch function of the choice element 207, the weight $w_k$ of $x_k$ saved temporarily in the W register is added to the result of the weighted correlating comparison. The sum is then sent to the WPE on the right. In the meanwhile, the received code symbol $x_k$ that has been compared as well as its weight $w_k$ are sent to the underlying WPE.

The weighted computation is as follows. The SSC decoding result of the first half of step 2 of the synchronization procedure is treated as the input to a weight, that is, $w_k$. Make a correlating comparison between the received code symbol and the code symbol that is saved in advance. If they are identical, that is, $x_k = h_k$, then conduct a switch by means of the choice element 207, by adding the weight $w_k$ of $x_k$ saved temporarily in the W register 206 to the result of the weighted correlating comparison.

Figure 6:
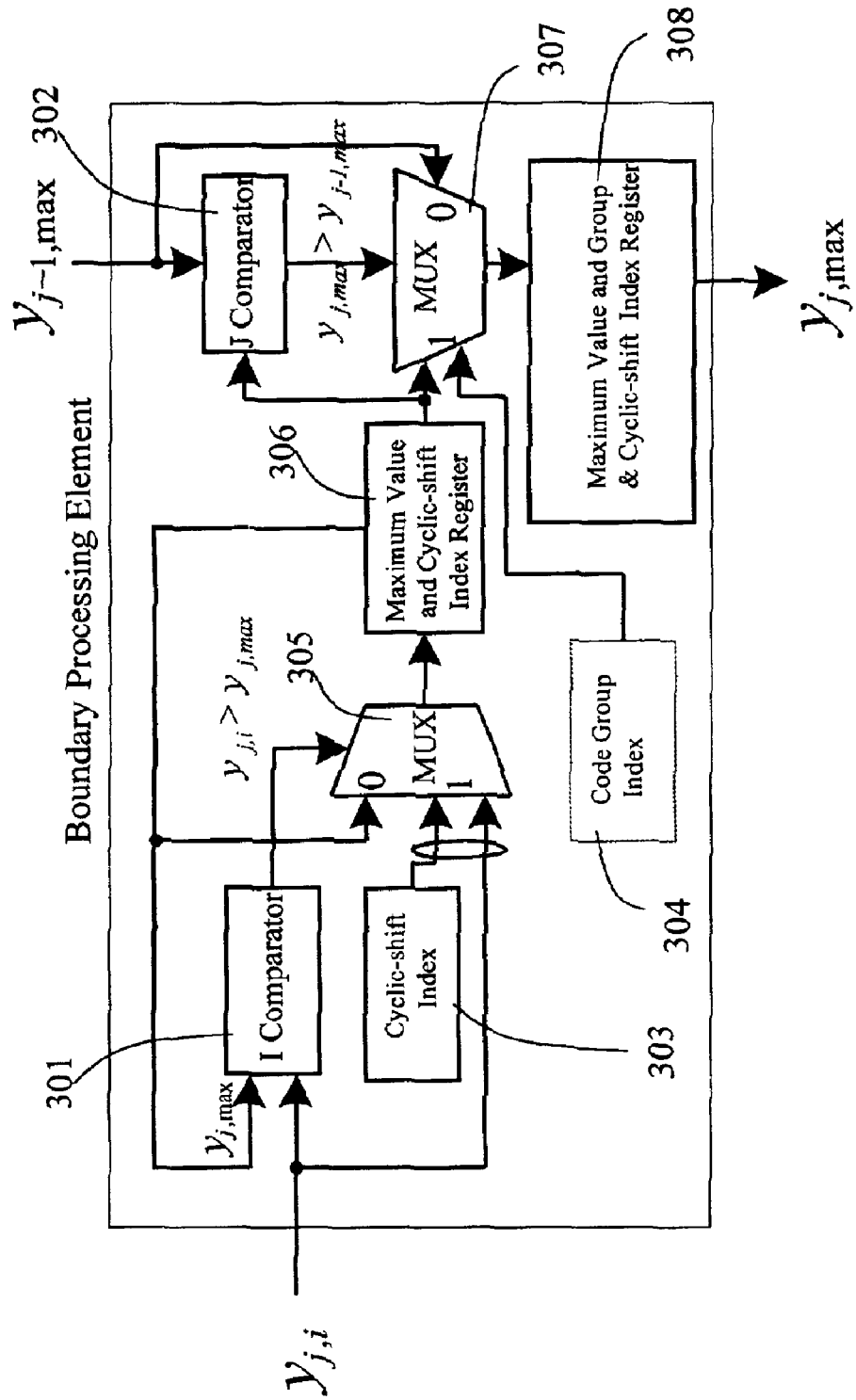
FIG. 6 depicts the circuit of BPE.

The 64×15 WPEA 20 connects to a set of 64×1 BPEA 30 that lies on its right. Each row of the WPEA 20 is in charge of making the correlating comparison with a CFRS codes. The last WPE output at the right end of each row is the result of correlating comparison, $y_{j,i}$. A BPE compares this comparison results, $y_{j,i}$. After comparing the 15 results of the same code, each BPE begins to compare the results of individual rows, as shown in FIG. 6.

The I comparator 301 is for comparing the results of the same row. A result that is greater is stored in the maximum value and cyclic-shift index register 306 first. After the maximum result of the same row has been generated, the J comparator 302 begins to compare the maximum value of the existing row with that of the overhead row, selects the greater one, saves it and its code group index j and cyclic-shift index i in the maximum value and group & cyclic-shift index register 308, and sends them to the underlying BPE. The multiplexer 305 makes reference to the result of I comparator 301, and saves the greater result value, $y_{j,i}$, and its cyclic-shift index i in the maximum value and cyclic-shift index register 306. In the event that the new $y_{j,i}$ value is greater than the $y_{j,max}$ value, that is, when the multiplexer 305 chooses line 1, then its cyclic-shift index i is provided by the cyclic-shift index 303. The multiplexer 307 makes reference to the result of J comparator 302, and saves the greater result value, $y_{j,i}$, its cyclic-shift index i and code group index j, etc., in the maximum value and group & cyclic-shift index register 308. In the event that the result of the existing row, $y_{j,max}$, is greater than the $y_{j-1,max}$ value of the overhead row, then its group index is provided by the code group index 304.

The output of the BPE at the bottom (that is, the output result of the maximum value and group & cyclic-shift index register 308) is the result of decoding. The comparison result of the greatest correlation is the desired decoding result. The code group index j of this result denotes that the CFRS code received, X, is the $j^{th}$ code of all the possible 64 CFRS codes, while the cyclic-shift index i denotes that the CFRS code received, X, results from i times of cyclic-shift of the original code symbol. According to the "Background of the Invention" section of this document, in the 3GPP W-CDMA, the code group index, j, denotes a code group, while the cyclic-shift index, i, denotes a frame boundary. This is the end of step 2 of the cell search.

Please refer to FIG. 3 again. The whole decoding procedure is: load the CFRS codes received to IPG 10; the IPG 10 generates 15 cyclic-shift versions in order; input the 15 cyclic-shift versions in a skewed-form to the 64×15 WPEA 20; the WPEA 20 makes correlating comparisons between the 15 cyclic-shift versions and 64 codes saved beforehand; a comparison is made on each row with respect to one set of possible CFRS codes; as regards the comparison result of a row, the BPE of the row identifies the most probable cyclic-shift position; search vertically, that is, from the top to the bottom, and find the greatest result of cyclic-shift position of individual rows; the output of the BPE at the bottom is the decoding result.

The decoding duration of this decoding circuit is 94 cycles. From the point of view of a system, the chip rate is 3.84 MHz. In general, the minimum frequency designed by a circuit should be 3.84 MHz. In other words, the designed circuit only spends time for a maximum 94 chips on decoding. Thus, there is sufficient time to prepare for the following step of determining scrambling codes in an ordinary synchronization procedure. Even if decoding has to be executed ten or twenty times in multi-candidate cell search algorithms, this decoder is able to finish decoding before the end of the slot wherein the $15^{th}$ secondary synchronization code is decoded. Thus it does not delay the execution of step 3 of the cell search procedure. The total time spent: 20 (number of times of decoding)*94 (the duration of decoding)+256 (receipt of the secondary synchronization code)=2136<2560 (slot length).

Figure 7B:
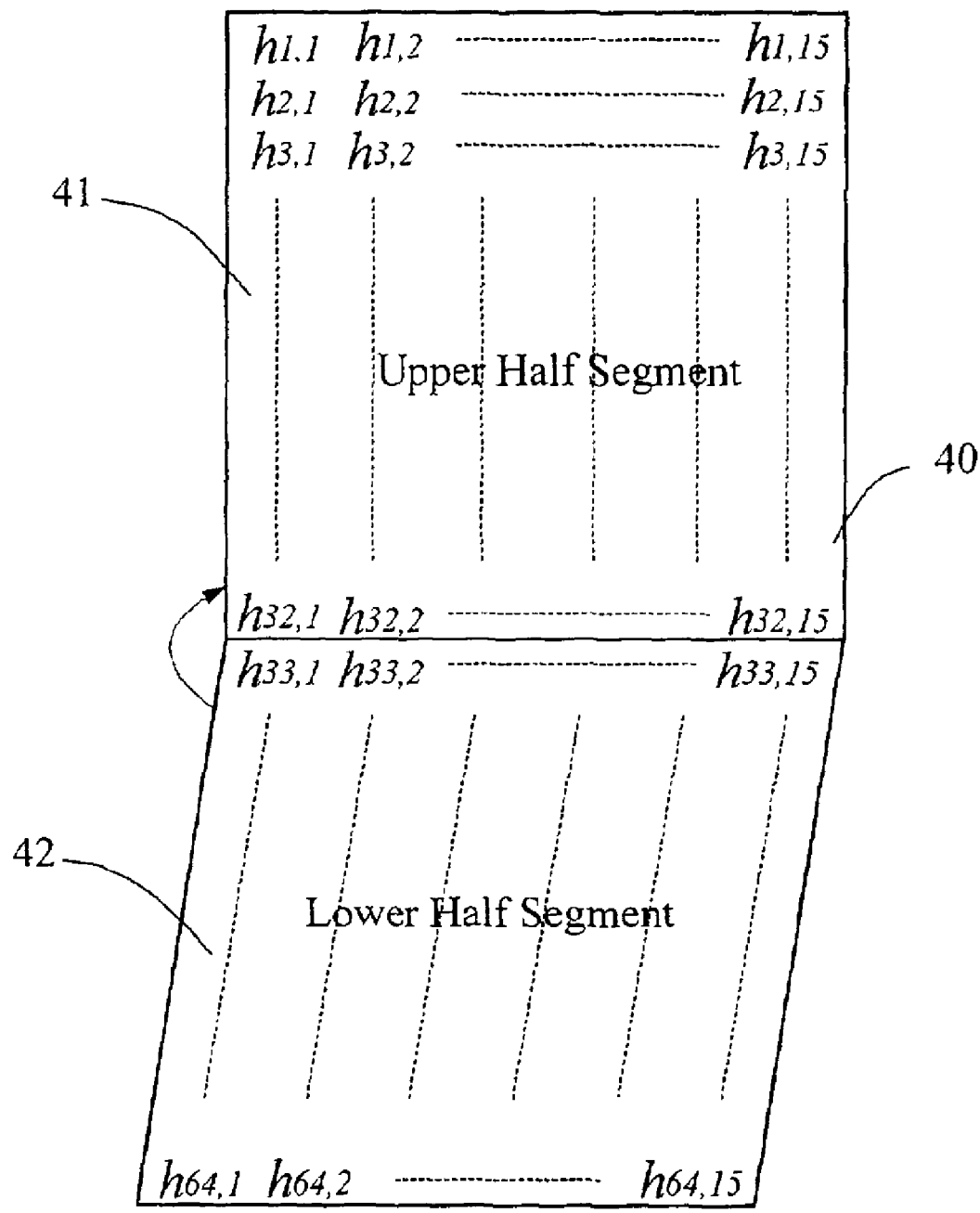
Figure 7C:
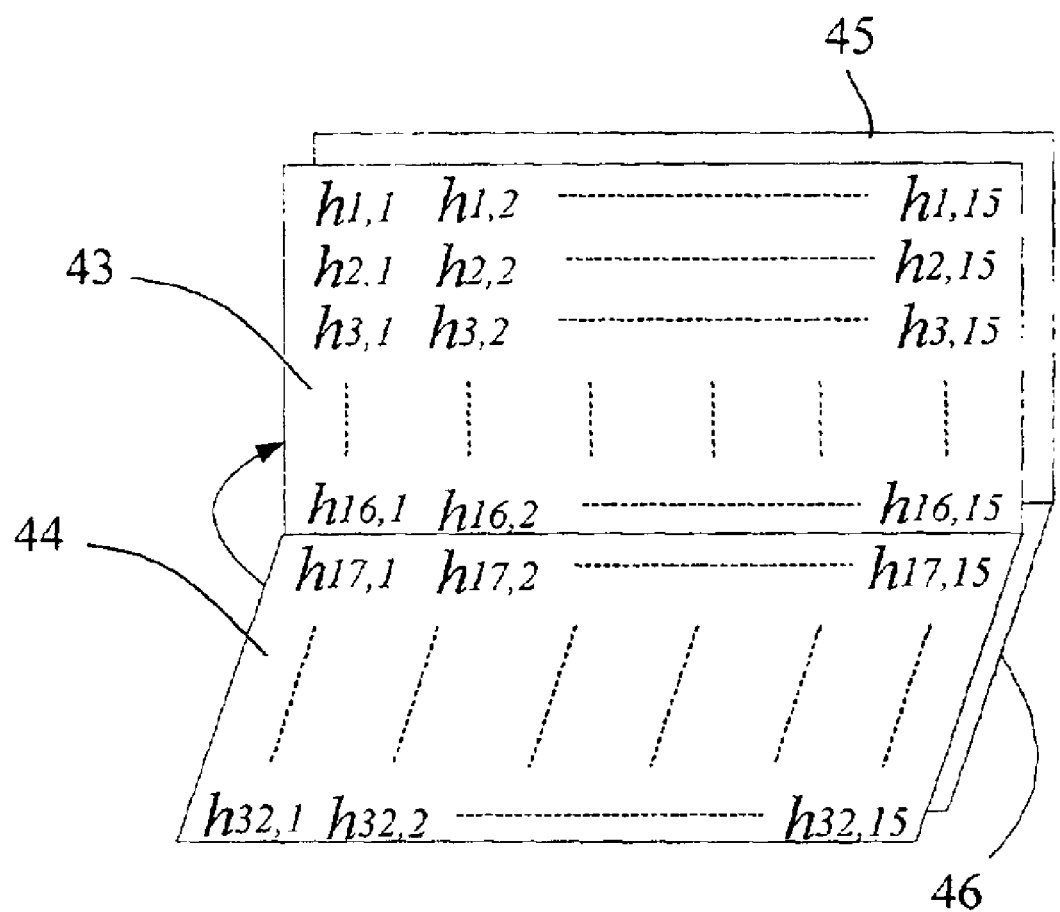
Figure 8:
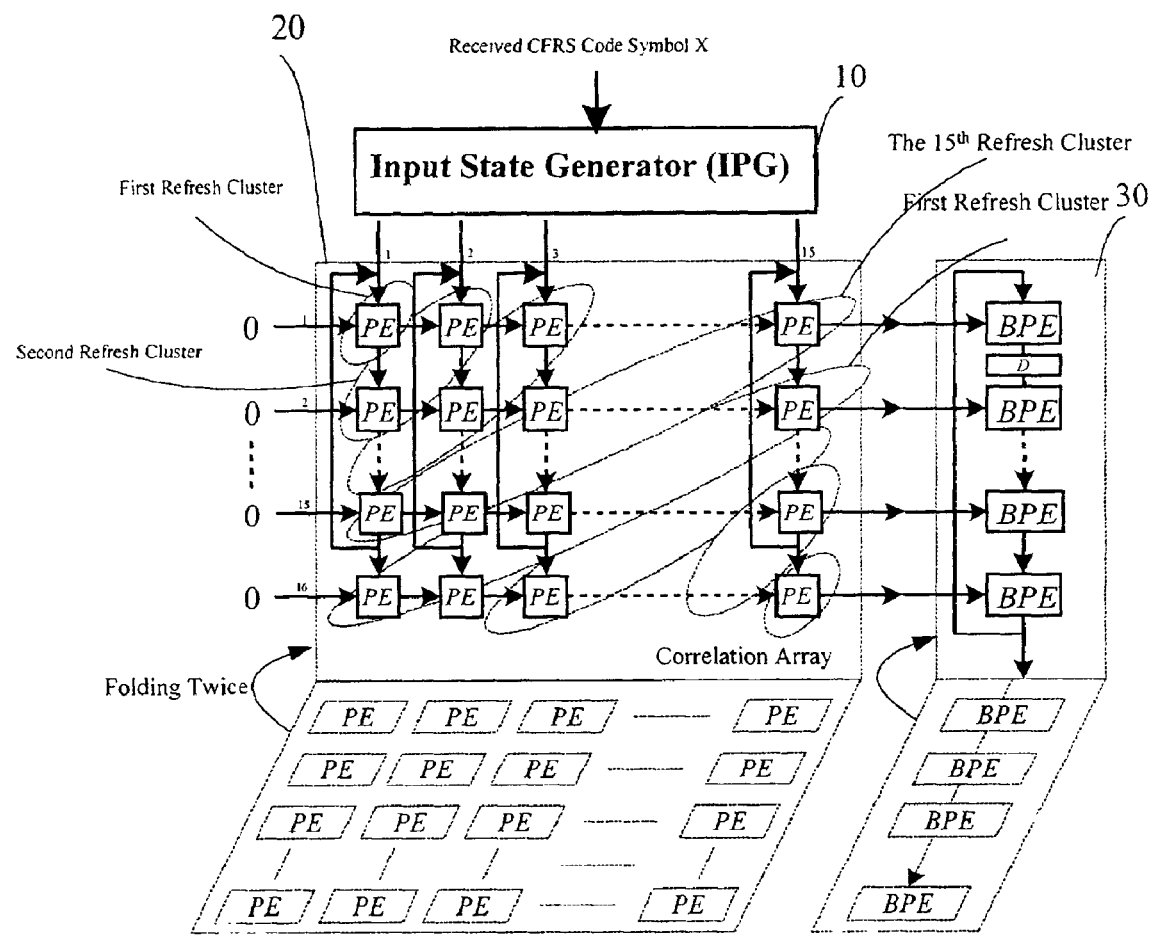
FIG. 8 shows a CFRS decoder based on the folding SA architecture; the number of times of folding is 2; the 64×15 array is reduced to a 16×15 array, but the decoding duration is still 94 cycles.

II. The Folding Technology and its Application to the Decoding Circuit Based on SA Architecture As regards the aforesaid decoding circuit based on SA architecture, with the folding technology put forward by the invention, the SA of the WPEA 20 is folded so that its size is reduced from 64×15 to 32×15 and thus its array area is reduced. As regards the code symbols that have to be saved beforehand, the 64×15 CFRS code symbol table 40 (shown in FIG. 7A) is also folded and thus turned into 32×15, as shown in FIG. 7B, comprising an upper half segment 41 and a lower half segment 42. Similarly, the 64×1 BPEA 30 is also folded and thus turned into 32×1. Despite the folding, a decoding speed of 94 cycles is maintained. The folding process does impact the decoding speed, depending on the number of times of folding. Explanation is herein given on the folding technology in a case where, for example, folding is carried out twice successively. As shown in FIG. 8, after the WPEA 20 has been folded twice, its original 64×15 systolic array is diminished and turned into a 16×15 systolic array. The CFRS code symbol table that has to be saved beforehand for the WPEA 20 is, by the same token, turned into four segments, namely the first segment 43, the second segment 44, the third segment 45 and the fourth segment 46, as shown in FIG. 7C. The maximum number of successive folds without jeopardizing decoding speed is two. FIG. 8 shows the architecture that results from the folding, wherein he IPG 10 and each WPE remain identical to their appearance shown in FIGS. 4, 5, respectively, thus they need not be modified. However, the BPE has to be slightly modified so that its architecture is capable of feedback, as shown in FIG. 6.

After two times of successive folding, the size of the WPEA 20 is reduced from 64×15 to 16×15, while the size of the BPEA 30 is also reduced from 64×1 to 16×1, thus the areas of both arrays decrease to one-fourth of their original sizes. The reduction in array area is achieved at the cost of the addition of a "refresh mechanism" for refreshing the code symbol, $h_k$, stored beforehand in the H register of the WPE. In other words, after two times of successive folding, the 64×15 CFRS code symbol table 40 originally stored in advance in the WPEA 20 (shown in FIG. 7A) is divided into four segments 43, 44, 45 and 46, as shown in FIG. 7C. The first time only one segment is placed in the H register of the WPEA 20 shown in FIG. 8. The second time one segment is saved first. Then, after the previous segment has been decoded, the code symbol of the next segment is refreshed by the refresh mechanism and saved in the WPE.

A refresh cluster is shown in FIG. 8, and a code symbol is refreshed cluster by cluster. In other words, each time only one cluster is refreshed. The formation of clusters depends on the execution condition of SA. After each WPE has made a correlating comparison with the last code symbol it receives, it should immediately make a correlating comparison for the code symbol of the next segment in the next cycle. Hence, it is necessary to refresh the code symbol saved beforehand in individual WPEs, that is, to refresh the content value in the H register. Since the execution of SA is conducted in a hierarchical pipelined manner, WPEs in individual rows must be refreshed, and the WPEs are separated from each other by one position. All the WPEs that have to be refreshed in the same cycle are collectively known as a refresh cluster. Clusters are refreshed in order, so that all the code symbols that are saved beforehand in 16 rows and are required to be refreshed can be refreshed simultaneously. There is a total of 15 refresh clusters, namely the first refresh cluster, the second refresh cluster, . . . the $15^{th}$ refresh cluster. They are refreshed in order, or, in other words, every cluster is refreshed every 15 cycles.

Figure 9:
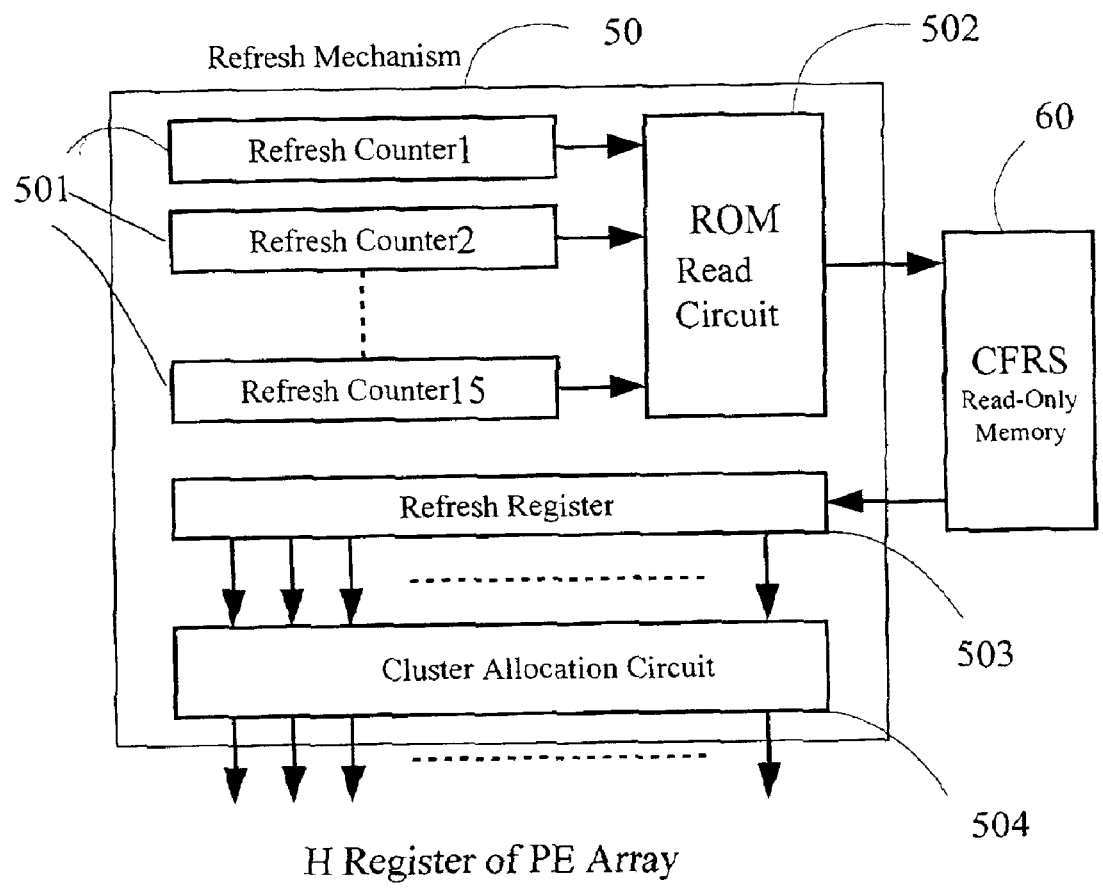
FIG. 9 depicts the circuit of a refresh mechanism.

FIG. 9 shows the refresh mechanism that comprises 15 refresh counters 501, a read circuit 502 of Read-Only Memory (ROM) 60, a refresh register 503 and a cluster allocation circuit 504. The 15 refresh counters 501 figure the time taken to refresh individual refresh clusters. Once the refresh time runs out, the refresh counters 501 trigger the read circuit 502 of Read-Only Memory (ROM) 60. The read circuit 502 then reads the code symbols of the next segment to be saved beforehand, and places the code symbols in the refresh register 503. The cluster allocation circuit 504 sends the new code symbols to the corresponding H register of the WPE (for saving CFRS code symbol beforehand). This is the way the refresh procedure is executed. The CFRS Read-Only Memory (ROM) 60 shown in FIG. 9 is the ROM that saves the 64×15 CFRS code symbol table 40, as shown in FIG. 7A.

In addition, as shown in FIG. 8, the code symbol received and sent downward by the 15$^{th}$ row of the WPEA20 has to be sent to the first row as feedback because, in the meantime, second segment decoding has to be started in the first row. The direct feedback exempts IPG 10 from generating skewed input repeatedly whenever a new segment is to be decoded. As a result, power consumption is reduced.

Please refer to FIG. 8. The decoding process of the folding architecture is as follows: IPG 10 generates the 15 types of cyclic-shift results of the received CFRS codes in order, and outputs these cyclic-shift results in a skewed form to the 16×15 WPEA20. In the meantime, the refresh mechanism loads and refreshes the code symbol of the first segment 43 shown in FIG. 7C according to the sequence of the refresh clusters. The WPEA20 makes a correlating comparison between these 15 cyclic-shift versions and the refreshed segment code symbols. A correlating comparison is made on a set of possible CFRS codes for each row. As regards the correlating comparison result of a row, the BPE of the row finds the most probable result of cyclic-shift, searches vertically, that is, from top to bottom, and find the most probable result of cyclic-shift of individual rows. The output of the BPE at the bottom is the decoding result for the first segment. This result has to be sent to the first BPE as feedback, and be compared with the result of the next segment.

After the refresh procedure executed by the refresh mechanism on the first cluster and the lapse of the following 15 cycles, the correlating comparison between the code symbol 43 of the first segment and the cyclic-shift of the received code symbol is completed. The code symbol 43 of the first segment has to be refreshed and turned into the code symbol 44 of the second segment, so that the third segment 45 and the fourth segment 46 can be refreshed by analogy. The process does not end unless and until the correlating comparison of the fourth segment is completed. The output of the BPE at the bottom is the decoding result.

The process of mathematical calculation for the decoding of folding architecture is similar to that of the architecture previously put forward, except that the components in charge of execution are different. The 16×15 WPEA20 and the 15×1 BPEA30 shown in FIG. 7 are repeatedly used. The concept of refreshing the codes saved beforehand and the concept of the refresh mechanism are incorporated into the design. As a result, the area of a decoder is reduced, but the decoding speed of the decoder is not. The decoding time required by the decoder remains the same, that is, 94 cycles.

Figure 10:
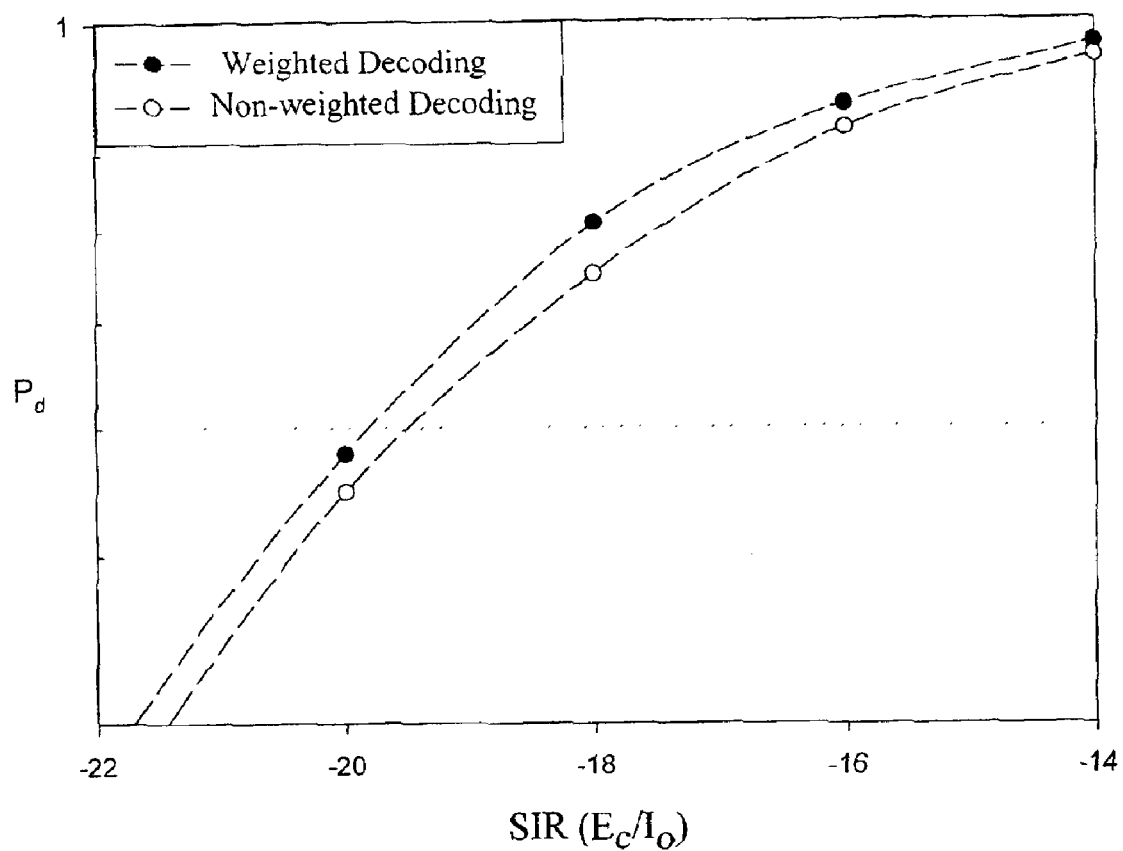
FIG. 10 compares the performance of weighted decoding with that of non-weighted decoding.

The CFRS decoding method put forward by the invention involves weighted correlating comparison. As shown in FIG. 10, given a weighted method, the effect of a decoding circuit can be increased by approximately 1~0.5-dB.

While the invention has been described by way of example and in terms of a preferred embodiment, it is to be understood that the invention is not limited thereto. It should be understood that the detailed description and specific examples, while indicating preferred embodiments of the invention, are given by way of illustration only, since various changes and modifications within the spirit and scope of the invention will become apparent to those skilled in the art from this detailed description. Therefore the scope of protection for the invention should conform to the claims attached below.

What is claimed is:

1. A weighted decoding method for Comma-Free Reed-Solomon (CFRS) codes applied to a wideband code division multiple access (W-CDMA) system which utilizes the detection of a primary synchronization code (PSC) generated in a first step of a synchronization procedure, said CFRS codes comprising 64 code groups, each code group containing 15 code symbols; comprising the steps of:

determining a received secondary synchronization code by coherently combining 16 secondary synchronization codes with said detected primary synchronization code to generate 16 coherent secondary synchronization code detection results and calculating the greatest value of said 16 coherent secondary synchronization code detection results;

treating said greatest value as a weight value of a received code symbol of said CFRS codes;

performing, 15 times, cyclic-shifting a received CFRS code and making a weighted correlating comparison, to acquire a cyclic-shift index for determining a frame boundary, said weighted correlating comparison being made between received code symbols of said CFRS codes and reference code symbols of said CFRS codes wherein when compared code symbols of said CFRS codes are identical, and the weight value of the compared received symbol is added to a comparison result.

2. The weighted decoding method of claim 1, wherein said cyclic-shift index is acquired by the equation:

$$(i, j) = \text{Arg}\left\{\max\{X_j \otimes H_j\}\begin{matrix}i = 0 - 14 \\ j = 0 - 63\end{matrix}\right\}$$

wherein i denotes the index for said 15 cyclic-shift versions, j denotes the index for said 64 CFRS codes, $X_i$ denotes the result of i time(s) of rightward cyclic-shift conducted by a decoding circuit on said CFRS codes received, while $X_0$ denotes the result of an arbitrary cyclic-shift of said received CFRS codes;

$X_1$ denotes the result of one rightward cyclic-shift conducted by said decoding circuit on the arbitrary cyclic-shift CFRS codes received, and $X_i = \{x_1, x_2, x_3, \ldots, x_{15}\}$, $x_k \in GF(16)$, $1 \leq k \leq 15$;

$H_j$ denotes one of the 64 sets of CFRS codes, and $H_j = \{h_1, h_2, h_3, \ldots, h_{15}\}$, $h_k \in GF(16)$, $1 \leq k \leq 15$;

$X_i \otimes H_j$ refers to making a weighted correlating comparison that is executed in the following way:

$$X_i \cdot H_j = \sum_{k=1}^{15} w_k (x_k \otimes h_k),$$

where k denotes the index of the code symbol in a correlating comparison, $w_k$ denotes the weighted value of the code symbol, $x_k$; $x_k \otimes h_k$ refers to making a correlating comparison between $x_k$ and $h_k$, wherein when they are identical, the result is 1, else 0.

3. A weighted decoding circuit for receiving and decoding a Comma-Free Reed-Solomon (CFRS) code comprising:

an input pattern generator, which receives CFRS codes as arbitrarily cyclic-shifted CFRS codes, for generating 15 cyclic-shift versions of the received CFRS codes for output to a systolic array in a skewed form;

a weighted processing element array composed of 64×15 weighted processing elements, for receiving the skewed-form CFRS codes to make weighted correlating comparisons and output weighted correlating comparison results; and a boundary processing element array composed of 64×1 boundary processing elements, for calculating the greatest of said correlating comparison results of each row of said systolic array, to find the greatest result of all rows and set an associated index as a decoding result.

4. The weighted decoding circuit of claim 3, wherein said input pattern generator is composed of a shift register, a Johnson counter and a masking combinational circuit;

said shift register receives the 15 symbols of said received CFRS code and their corresponding weights, cyclically shifts them and outputs them as 15 cyclic-shift versions of said CFRS code and weights;

said Johnson counter sends a mask counting signal to said combinational circuit; and said masking combinational circuit outputs the skewed-form CFRS codes according to said mask counting signal.

5. The weighted decoding circuit of claim 3, wherein each of said boundary processing elements is composed of a first comparator, a second comparator and a combinational circuit;

said first comparator compares the results of the same said row, while said second comparator compares the comparison results of individual rows; and said combinational circuit stores temporary results of said first comparator and those of said second comparator, and sends the comparison result of said same row to said second comparator for comparison after said first comparator has made a comparison with respect to said same row.

6. The weighted decoding circuit of claim 3, wherein each of said weighted processing elements is composed of a first register, a second register, a third register, a fourth register, a XNOR-AND combinational circuit, an accumulator and a choice element;

said first register stores reference symbols of said CFRS codes beforehand;

said second register stores the received code symbols of said CFRS codes to facilitate further processing;

said third register stores said correlating comparison results;

said fourth register stores a weight value;

said XNOR-AND combinational circuit compares two code symbols in said first register and said second register, respectively, to see whether they are identical;

said choice element decides whether said weight value is to be added to a final result according to said combinational circuit comparison result; and said accumulator adds said weight value to the final result.

7. The weighted decoding circuit of claim 6, wherein said weight value is acquired by means of a received primary synchronization code detected in a first step of a synchronization procedure of a wideband code division multiple access system, and said weight value is acquired by determining the secondary synchronization code by the steps of:

coherently combining 16 secondary synchronization codes with said primary synchronization code; and calculating the greatest value of said 16 secondary synchronization codes and treating it as said weight value.

8. A folding weighted Comma-Free Reed-Solomon (CFRS) decoding circuit, comprising:

an input pattern generator, which receives CFRS codes as arbitrarily cyclic-shifted CFRS codes, for generating 15 cyclic-shift versions of said received CFRS codes for output to a systolic array in a skewed form;

a plurality of weighted processing element array assignments folded at least one time relative to element assignments for a systolic array composed of 64×15 weighted processing elements, for receiving the skewed-form CFRS to codes to make weighted correlating comparisons and output a weighted correlating comparison result;

a plurality of boundary processing element array assignments folded at least one time from relative to element assignments for a systolic array composed of 64×1 boundary processing elements, for calculating a greatest correlating comparison result of each row of said systolic array, and to find a greatest result of all rows and set an associated index as a decoding result; and a refresh mechanism for refreshing a reference code symbol saved in advance in each said processing element.

9. The decoding circuit of claim 8, wherein the number of times of folding relative to the systolic array architecture formed by said 64×15 processing elements and the systolic array architecture of the 64×1 boundary processing elements is two.

10. The decoding circuit of claim 8, wherein said input pattern generator is composed of a shift register, a Johnson counter and a masking combinational circuit;

said shift register receives the 15 symbols of said CFRS codes with weight values, cyclically shifts them and outputs them as 15 cyclic-shift versions of said CFRS codes with weight values;

said Johnson counter sends a masking signal to said masking combinational circuit; and said masking combinational circuit outputs the skewed-form CFRS codes according to said masking signal.

11. The decoding circuit of claim 8, wherein each of said weighted processing elements is composed of a first register, a second register, a third register, a fourth register, a XNOR-AND combinational circuit, an accumulator and a choice element;

said first register stores the reference symbols of said CFRS codes beforehand;

said second register stores the received code symbols of said CFRS codes to facilitate further processing;

said third register stores said correlating comparison results;

said fourth register stores a weight value;

said XNOR-AND combinational circuit compares the two code symbols in said first register and said second register, respectively, to see whether they are identical;

said choice element decides whether said weight value is to be added to a final result, according to said combinational circuit comparison result; and said accumulator adds said weight value to the final result.

12. The decoding circuit of claim 8, wherein each of said boundary processing elements is composed of a first comparator, a second comparator and a combinational circuit;

said first comparator compares the results of the same row, while said second comparator compares the comparison results of individual rows;

said combinational circuit stores temporary results of said first comparator and those of said second comparator, and sends the comparison result of said same row to said second comparator for comparison after said first comparator has made a comparison with respect to said same row.

13. The decoding circuit of claim 8, wherein said refresh mechanism is composed of a plurality of counters, a read circuit of a Read-Only Memory (ROM), a refresh register and a cluster allocation circuit;

said plurality of counters determine the time taken to refresh individual refresh clusters in a duration of determining 15 refresh clusters;

once the refresh time runs out, said ROM read circuit reads the reference CFRS code symbol to be saved beforehand, and places the reference CFRS code symbol in said refresh register;

said cluster allocation circuit then sends the reference CFRS code symbol to said first register of said corresponding processing element for saving said reference CFRS code symbol beforehand to complete the refresh procedure; and the formation of said 15 refresh clusters depends on the execution condition of said systolic array.

14. The decoding circuit of claim 8, wherein each of said weighted processing elements is composed of a first register, a second register, a third register, a fourth register, a XNOR-AND combinational circuit, an accumulator and a weight adder;

said first register stores the reference symbols of said CFRS codes beforehand;

said second register stores the received code symbols of said CFRS codes so as to facilitate their further processing;

said third register stores said correlating comparison results;

said fourth register stores a weight value;

said XNOR-AND combinational circuit compares the two code symbols in said first register and said second register, respectively, to see whether they are identical;

said weighted value adder decides whether said weight value is to be added to a final result, according to said correlating comparison result; and said accumulator adds the weight value to the final result.

15. The decoding circuit of claim 14, wherein said weight value is acquired by means of detection of a primary synchronization code (PSC) generated in a first step of a synchronization procedure of a wideband code division multiple access (W-CDMA) system, and said weight value is acquired by the steps of:

determining the received secondary synchronization code by coherently combining 16 sets of secondary synchronization codes with said primary synchronization code; and calculating the greatest value of said 16 sets of secondary synchronization codes and treating it as said weight value.

* * * * *